(12) United States Patent
Feng et al.

(10) Patent No.: US 7,956,365 B2
(45) Date of Patent: Jun. 7, 2011

(54) ALTERNATING CURRENT LIGHT EMITTING DEVICE WITH PLURAL CONDUCTORS OF ELECTRODES FOR COUPLING TO ADJACENT LIGHT EMITTING UNIT

(75) Inventors: Hui Ching Feng, Taoyuan (TW); Kuo-Chin Huang, Taoyuan (TW); Shyi-Ming Pan, Taoyuan (TW); Hung-Li Pan, Taoyuan (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 361 days.

(21) Appl. No.: 12/329,770

(22) Filed: Dec. 8, 2008

(65) Prior Publication Data

US 2010/0052494 A1 Mar. 4, 2010

(30) Foreign Application Priority Data

Sep. 4, 2008 (TW) ................................ 97133955 A

(51) Int. Cl.
*H01L 29/26* (2006.01)
*H01L 23/12* (2006.01)

(52) U.S. Cl. ................ 257/79; 257/81; 257/88; 257/91; 257/918; 257/96; 257/97; 257/98; 257/700; 257/748; 257/781; 257/E51.022; 257/E33.001

(58) Field of Classification Search .................... 257/79, 257/81, 88, 91, 96, 97, 98, 918, 700, 748, 257/781, E51.022, E33.001
See application file for complete search history.

(56) References Cited

U.S. PATENT DOCUMENTS 3,611,069 A * 10/1971 Galginaitis et al. ............. 257/90
* cited by examiner

*Primary Examiner* — Thanh V Pham
(74) *Attorney, Agent, or Firm* — Ming Chow; Sinorica, LLC

(57) ABSTRACT

An alternating current (AC) light emitting device is revealed. The AC light emitting device includes a substrate and a plurality of light emitting units arranged on the substrate. The light emitting unit consists of a first semiconductor layer, a light emitting layer, a second semiconductor layer, at least one electrode and at least one second electrode respectively arranged on the first semiconductor layer and the second semiconductor layer from bottom to top. The plurality of light emitting units is coupled to at least one adjacent light emitting unit by a plurality of conductors. By the plurality of conductors that connect light emitting units with at least one adjacent light emitting unit, an open circuit will not occur in the AC light emitting device once one of the conductors is broken.

18 Claims, 10 Drawing Sheets

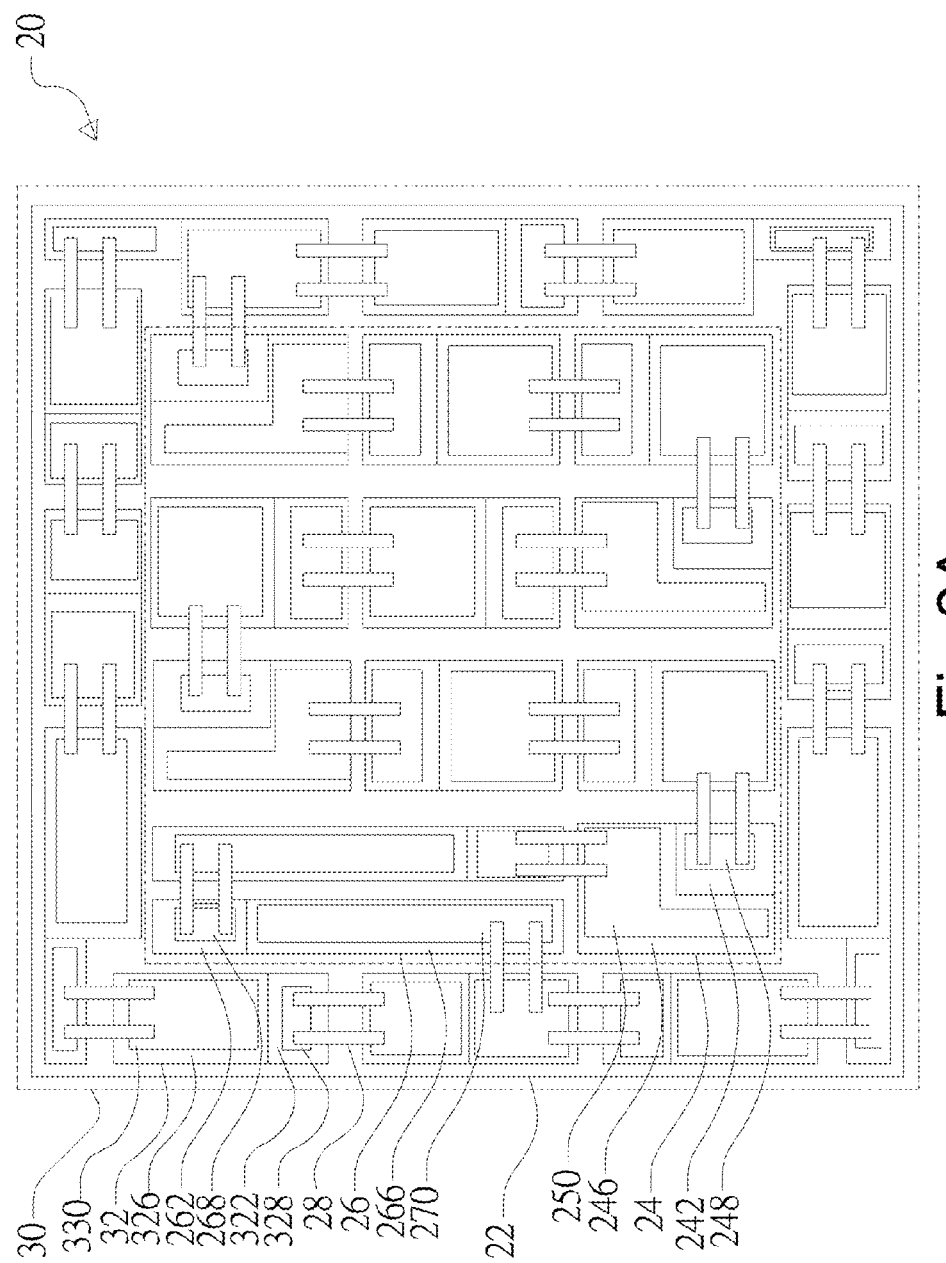

ALTERNATING CURRENT LIGHT EMITTING DEVICE WITH PLURAL CONDUCTORS OF ELECTRODES FOR COUPLING TO ADJACENT LIGHT EMITTING UNIT

BACKGROUND OF THE INVENTION

1. Field of Invention

The present invention relates to a light emitting device, especially to an alternating current (AC) light emitting device.

2. Description of Related Art

Light emitting diode (LED) is a light emitting element made of semiconductor material. The light source includes two electrodes. After being applied with voltage (minimum current), the electron-hole recombination process produces some photons due to energy gap of electrons and electron-holes. Thus the LED emits light. The LED is different from a general Incandescent bulb and it's a cold illuminant with features of low power consumption, long lifetime, no idle time, and fast reaction. Moreover, the LED has compact volume, good shock resistance, and suitableness for mass production. Thus the LED is easily to be produced in the form mini-type or array-type element according to users' requirements. It has been applied to electrical appliances, computers and communication products and has become one of the essentials in our daily lives. Generally, a power source is an alternative current (AC). In use, the AC supply should be converted into DC voltage before being applied to semiconductor optoelectronics. Thus an AC to DC converter is added into a driving circuit of semiconductor optoelectronics. Therefore, the cost is increased. Moreover, during the process the AC being converted into the DC, the operational efficiency of the semiconductor optoelectronics is reduced due to power loss. Thus there is a need to develop semiconductor optoelectronics driven directly by an AC supply such as AC light emitting devices with a plurality of light emitting units.

Refer from FIG. 1A & FIG. 1B, a schematic diagram and a circuit diagram of a conventional alternating current (AC) light emitting device are disclosed. The conventional AC light emitting device 10 consists of a substrate 12, a first lighting module 14 and a second lighting module 16. The substrate 12 is disposed with a first electrode 122 and a second electrode 124. The first lighting module 14 as well as the second lighting module 16 is also arranged on the substrate 12. The first lighting module 14 and the second lighting module 16 are respectively coupled to the first electrode 122 and the second electrode 124. The first lighting module 14 includes a plurality of first light emitting units 142 that are electrically connected in series by a first conductor 144. The second lighting module 16 includes a plurality of second light emitting units 162 that are electrically connected in series by a second conductor 164. The total area of the multiple first light emitting units 142 is the same with that of the multiple second light emitting units 162. But electrical properties of the series connection of the first light emitting units 142 are different from electrical properties of the series connection of the second light emitting units 162. The simplified circuit diagram of the conventional AC light emitting device 10 is shown in FIG. 1B. The electrical properties of series connection of the first lighting module 14 and those of the second lighting module 16 are opposite and they are coupling in an AC power source 18. By opposite electrical properties of series connection of the first lighting module 14 and of the second lighting module 16, the first light emitting units 142 of the first lighting module 14 and the second light emitting units 162 of the second lighting module 16 emit light in turns within a positive and a negative half-wave cycle of the applied power source 18.

However, the plurality of first light emitting units 142 of the first lighting module 14 and the plurality of second light emitting units 162 of the second lighting module 16 respectively occupy half of the area of the substrate 12. Thus within the wave cycle of an AC power, the lighting area of the conventional AC light emitting device 10 is only half of the total area. Thus the lighting efficiency provided by lighting area of the first lighting module 14 and that of the second lighting module 16 of the conventional AC light emitting device 10 is only half of original light emitting efficiency. Moreover, within the plurality of first light emitting units 142 and the plurality of second light emitting units 162 of the AC light emitting device 10, the light emitting unit is electrically coupled to an adjacent light emitting unit by one conductor 144, 164. Thus once one of the conductors 144, 164 is broken, an open circuit occurs in one of the first lighting module 14 and the second lighting module 16 of the conventional AC light emitting device 10 so that the lighting module will not emit light. Therefore, the conventional AC light emitting device 10 only works during a positive or a negative half-wave cycle.

In order to solve above problem of lighting area, a light emitting device is disclosed in Pub. No.:WO2007083885 "LIGHT EMITTING DEVICE WITH LIGHT EMITTING CELLS ARRAYED" applied by Mr. LEE, Jae-Ho. The light emitting device comprises a substrate, a light emitting cell block, and a bridge rectifying circuit. The light emitting cell block and the bridge rectifying circuit are disposed on the substrate. The bridge rectifying circuit is arrayed to surround the light emitting cell block while the bridge rectifying circuit includes a plurality of diodes and the light emitting cell block consists of a plurality of light emitting cells. The plurality of light emitting cells is electrically coupled in series by a wire. The bridge rectifying circuit is provided on the substrate surrounding a peripheral portion of the light emitting cell block, occupying surrounding area of the substrate. Thus the bridge rectifying circuit reduced effective lighting area of the device. The diodes area electrically connected in series by a wire. Thus if one of the wires is broken, an open circuit occurs in one of the bridge rectifying circuit and the light emitting cell block. Therefore, the bridge rectifying circuit and the light emitting cell block will have a breakdown.

In order to solve above problems, there is a need to invent a new AC light emitting device that increases effective lighting area for improving light emitting efficiency by disposition of light emitting units with various area on the substrate. Moreover, the adjacent light emitting units of a plurality of light emitting units are coupled with each other by a plurality of wires.

SUMMARY OF THE INVENTION

Therefore it is a primary object of the present invention to provide an AC light emitting device in which light emitting units are electrically coupled with adjacent light emitting units by a plurality of conductors so as to prevent an open circuit formed in the device when one of the conductors is broken.

It is another object of the present invention to provide an AC light emitting device that increase light emitting efficiency by disposition of light emitting units with various area on a substrate.

In order to achieve objects, an AC light emitting device of the present invention consists of a substrate and a plurality of light emitting units arranged on the substrate. The light emitting unit consists of a first semiconductor layer, a light emitting layer, a second semiconductor layer, at least one electrode and at least one second electrode respectively arranged on the first semiconductor layer and the second semiconductor layer from bottom to top. A plurality of first light emitting units and a plurality of second light emitting units are coupled to at least one adjacent light emitting unit by a plurality of conductors. Because each light emitting unit of the present invention is coupled to adjacent light emitting unit by a plurality of conductors, an open circuit will not occur once one of the conductors is broken. The AC light emitting device still works normally. Moreover, by light emitting units with various areas, the total light emitting area is increase.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 2A is a top view of an embodiment of an AC lighting device according to the present invention;

DETAILED DESCRIPTION OF THE PREFERRED EMBODIMENT

Figure 1A:
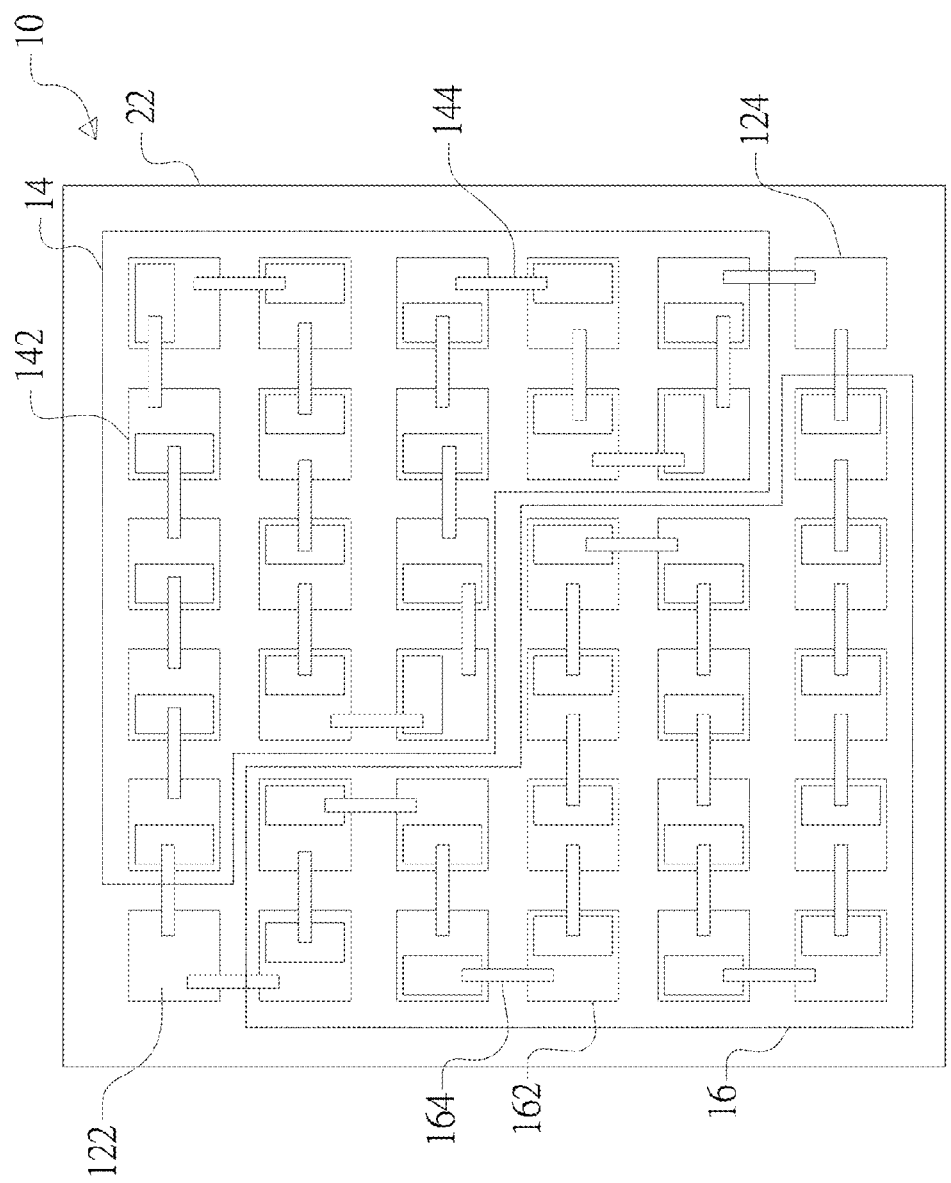
FIG. 1A is a top view of a conventional AC lighting device.
Figure 1B:
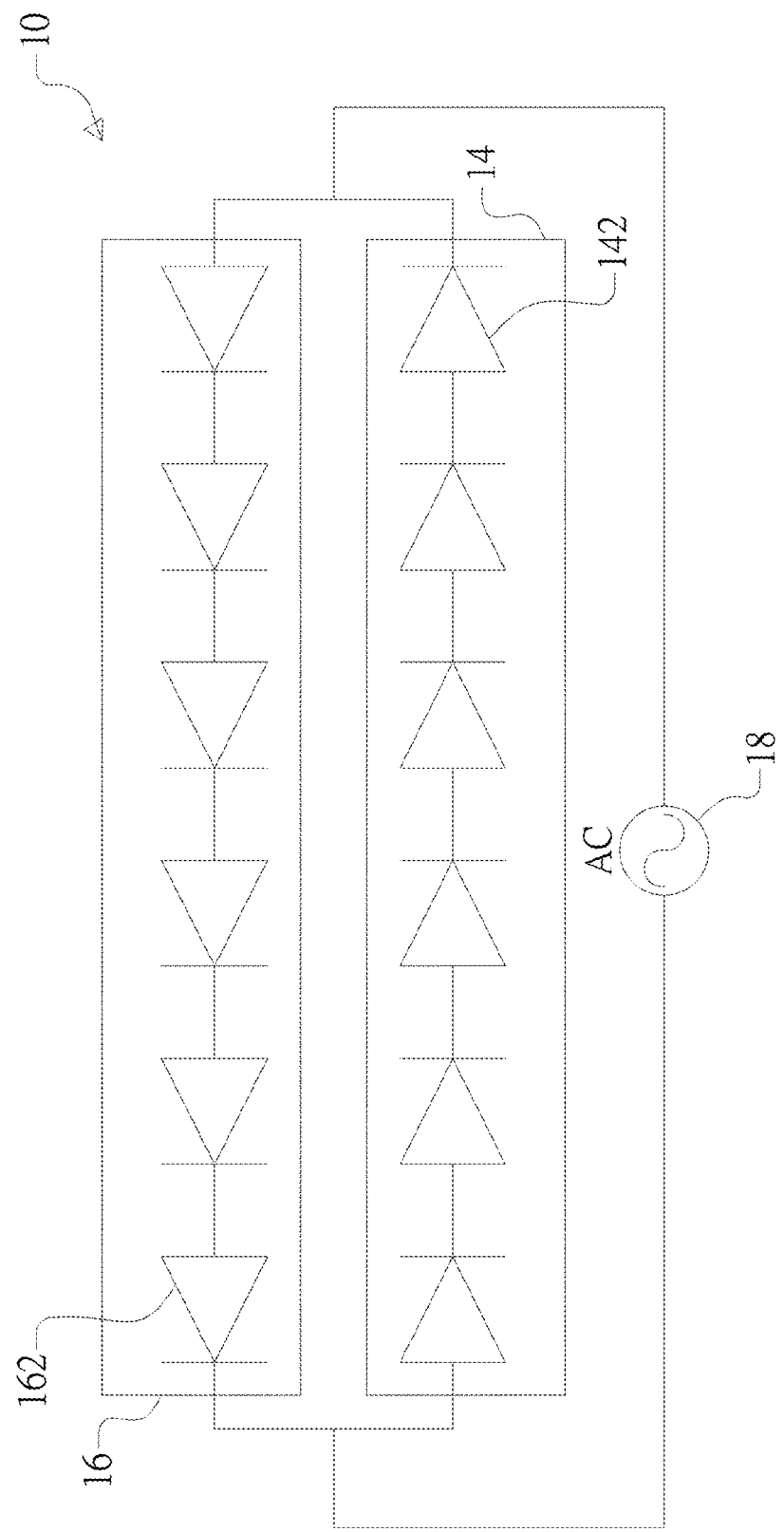
FIG. 1B is a circuit diagram of a conventional AC lighting device.
Figure 2B:
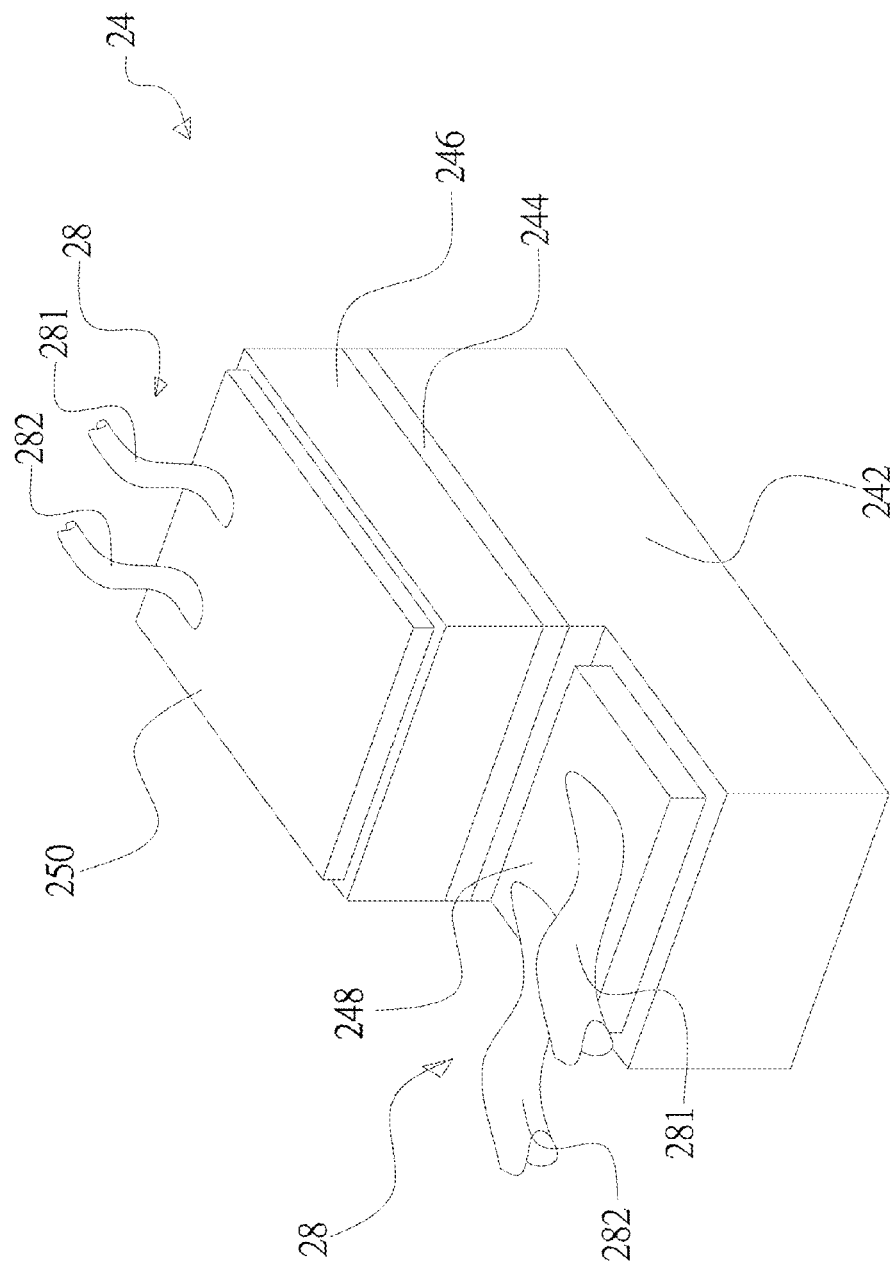
FIG. 2B is a schematic drawing showing part of an embodiment of an AC lighting device according to the present invention.
Figure 2C:
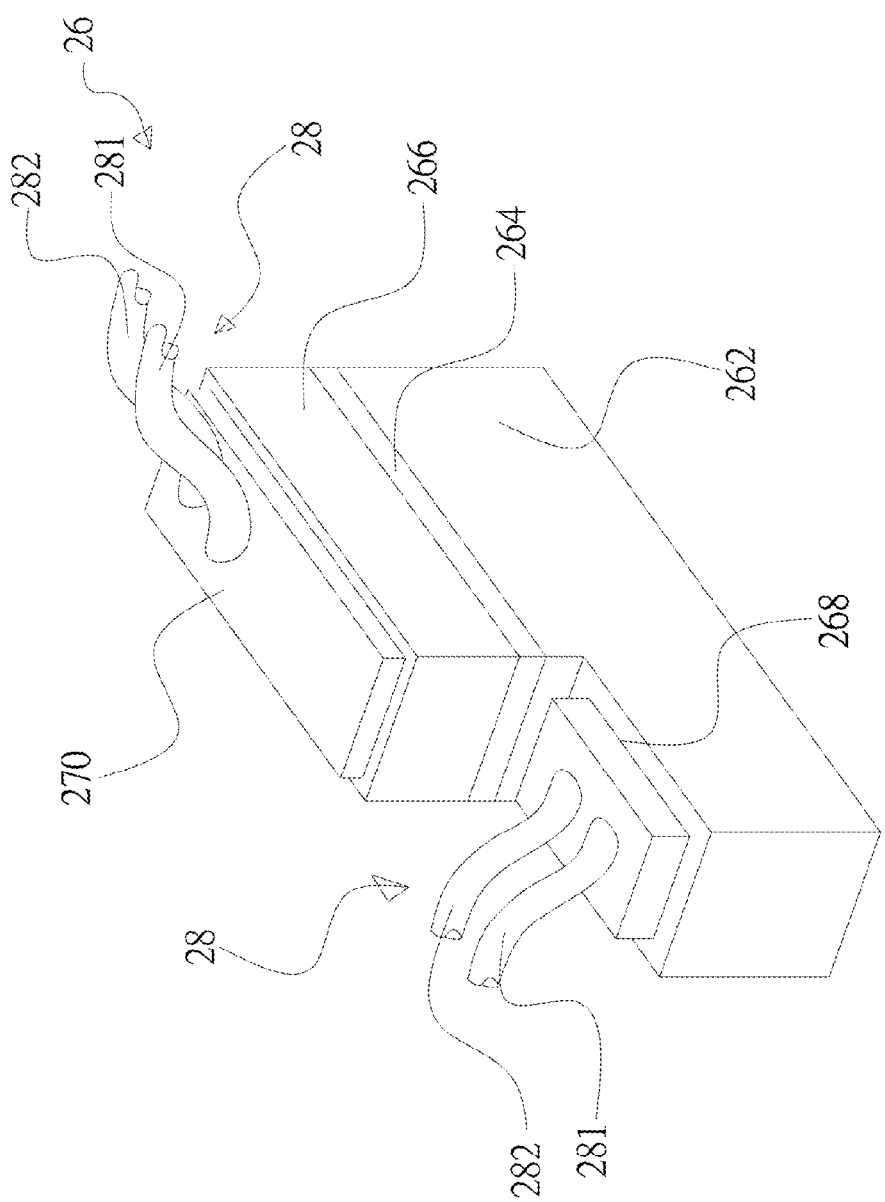
FIG. 2C is a schematic drawing showing part of an embodiment of an AC lighting device according to the present invention.

Refer from FIG. 2A to FIG. 2C, a top view and schematic drawings of an embodiment according to the present invention are revealed. As shown in FIG. 2A, an AC lighting device 20 of the present invention includes a substrate 22, a plurality of first light emitting units 24, a plurality of second light emitting units 26 and a plurality of conductors 28. The plurality of first light emitting units 24 and the plurality of second light emitting units 26 are respectively disposed on the substrate 22 and occupy different area. The first light emitting unit 24 and the second light emitting unit 26 are semiconductor epitaxial layers. The plurality of first light emitting units 24 is coupled with adjacent light emitting units by means of a first conductor 281 and a second conductor 282 of the plurality of conductors 28, so does the plurality of the second light emitting units 26. In this embodiment, both the first light emitting units 24 and the second light emitting units 26 are connected with the adjacent light emitting units by the conductors 28.

Refer to FIG. 2B, from bottom to top, the first light emitting unit 24 includes a first semiconductor layer 242, a first light emitting layer 244 and a second semiconductor layer 246. The second semiconductor layer 246 is arranged over the first light emitting layer 244 so that only the first semiconductor layer 242 and the second semiconductor layer 246 of the first lighting unit 24 can be seen from the top view. As shown in FIG. 2A, the first semiconductor layer 242 and the second semiconductor layer 246 respectively are disposed with a first electrode 248 and a second electrode 250 while both the first electrode 248 and the second electrode 250 are coupled to adjacent light emitting units by the first conductor 281 and the second conductor 282 of the conductors 28. Refer to FIG. 2C, the second light emitting unit 26 consists of a third semiconductor layer 262, a second light emitting layer 264 and a fourth semiconductor layer 266 from bottom to top. Due to the fourth semiconductor layer 266 disposed over the second light emitting layer 264, only the third semiconductor layer 262 and the fourth semiconductor layer 266 of the second light emitting unit 26 can be seen from the top view. As shown in FIG. 2A, the third semiconductor layer 262 and the fourth semiconductor layer 266 respectively are disposed with a third electrode 268 and a fourth electrode 270 while both the third electrode 268 and the fourth electrode 270 are coupled to adjacent light emitting units by the first conductor 281 and the second conductor 282 of the conductors 28.

Back to FIG. 2A, according to positions of the first light emitting unit 24, connection (coupled) directions of the plurality of the conductors 28 can be horizontal and vertical. Thus the connection direction of the conductors 28 changes along with disposition of the first light emitting units 24. The directions of some of the conductors 28 of the first light emitting units 24 connected to adjacent light emitting units are the same while the directions of other conductors 28 are different. As shown in FIG. 2B, the first semiconductor layer 242 of the first light emitting unit 24 is coupled to the second semiconductor layer 246 or the fourth semiconductor layer 266 of adjacent lighting unit by the first conductor 281 and the second conductor 282 of the plurality of the conductors 28. The second semiconductor layer 246 of the of the first light emitting unit 24 is also coupled to the first semiconductor layer 242 or the third semiconductor layer 262 of adjacent lighting unit by the first conductor 281 and the second conductor 282 of the plurality of the conductors 28. In similar way, the directions of first conductors 281 as well as the second conductors 282 may be the same or different. As shown in FIG. 2C, the second light emitting unit 26 is coupled to adjacent light emitting units by the first conductors 281 and the second conductors 282 of the conductors 28 that connect the third semiconductor layer 262 with the second semiconductor layer 246 or the fourth semiconductor layer 266. Or the second light emitting unit 26 is coupled to adjacent light emitting units by the first conductors 281 and the second conductors 282 of the conductors 28 that connect the fourth semiconductor layer 266 with the first semiconductor layer 242 or the third semiconductor layer 262. Moreover, the coupled direction of the conductors 28 can be parallel or non-parallel.

Due to different area of the first light emitting unit 24 and that of the second light emitting unit 26, it is convenient to increase disposition area of light emitting units of the first light emitting unit 24 as well as of the second light emitting unit 26 on the substrate. Furthermore, the second semiconductor layer 246 of the first light emitting unit 24 is with various geometric figures and this favors disposition of the conductors. The light emitting units 24, 26 are coupled to adjacent light emitting units by the first conductors and 281 and the second conductors 282 of the conductors 28. Thus when there is only one of the conductors 28 broken, there will not be an open circuit created in the AC light emitting device 20. Therefore, the AC lighting device 20 of the present invention can still work normally while one of the conductors 28 is broken. Moreover, due to the first conductor 281 and the second conductor 282 of the plurality of conductors 28 that connect the light emitting units 24, 26 with adjacent light emitting units, more current flows through the light emitting units of the AC lighting device 20 along with increasing number of the conductors.

Figure 2D:
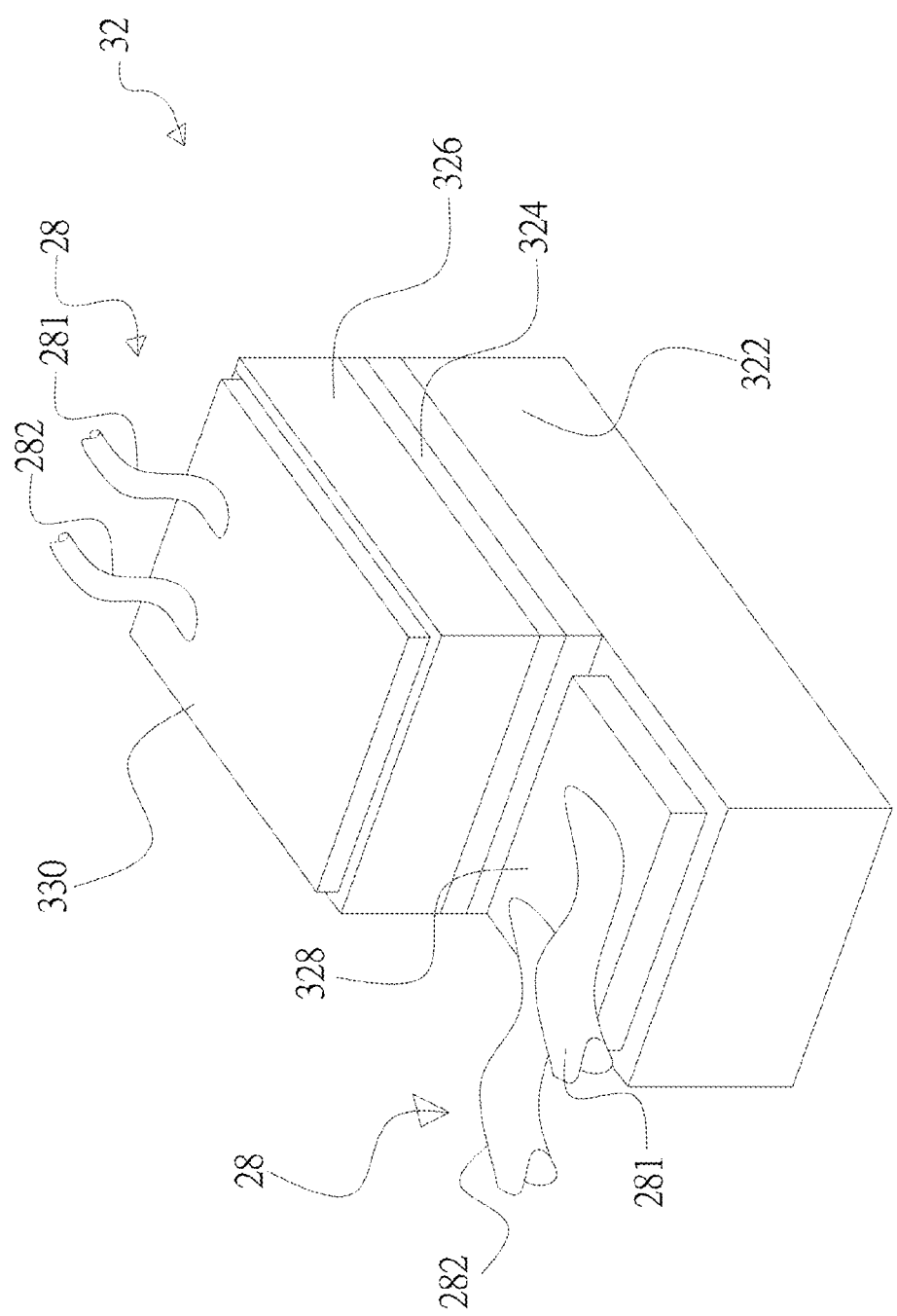
FIG. 2D is a schematic drawing showing part of an embodiment of an AC lighting device according to the present invention.
Figure 2E:
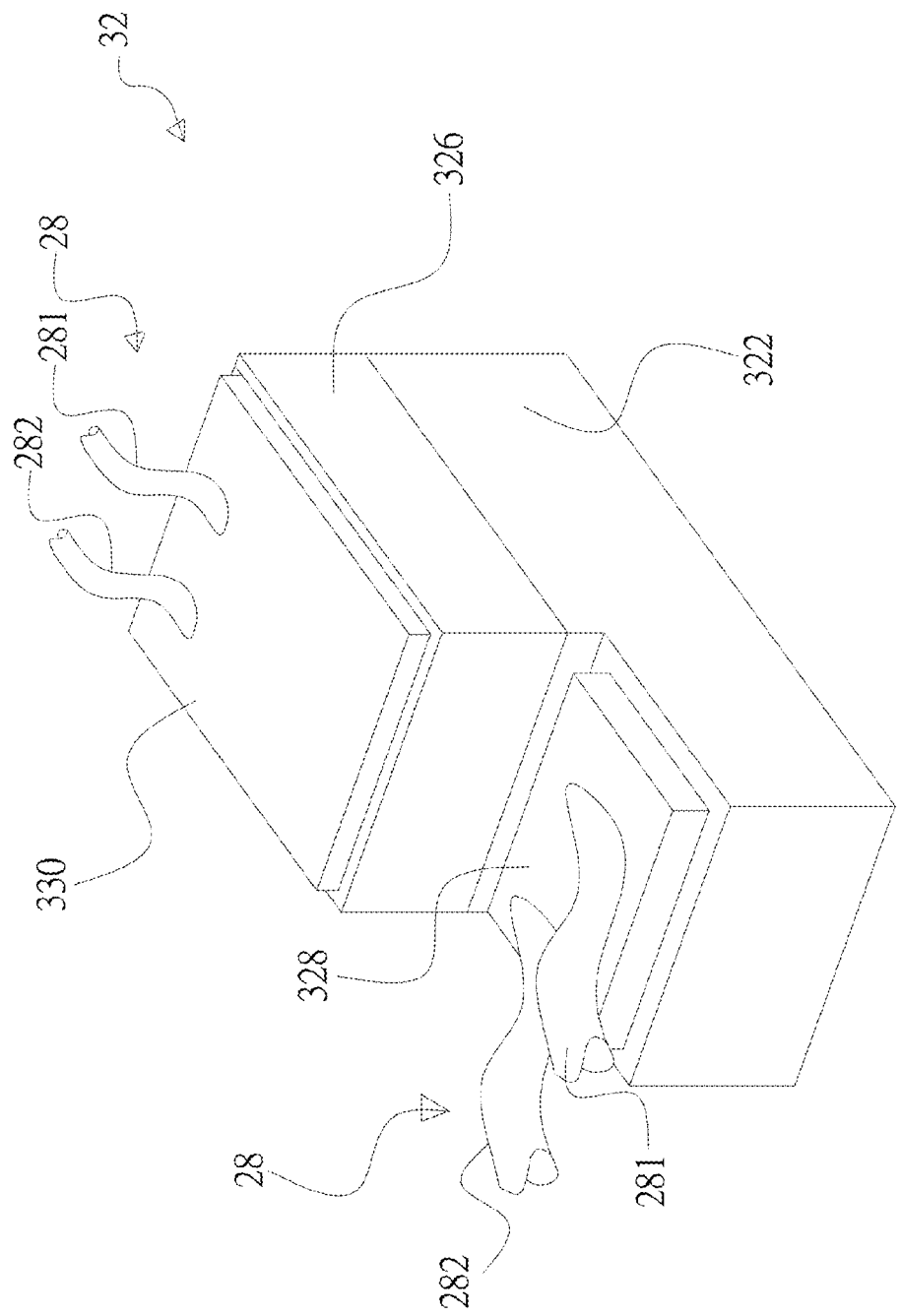
FIG. 2E is a schematic drawing showing part of an embodiment of an AC lighting device according to the present invention.

In addition, the embodiment further includes a bridge rectifier circuit 30 disposed on the substrate 33. The bridge rectifier circuit 30 consists of a plurality of semiconductor epitaxial layers 32. The semiconductor epitaxial layers 32 can be a plurality of third light emitting units or a plurality of diodes. Once the semiconductor epitaxial layers 32 are the third lighting unit, it includes a fifth semiconductor layer 322, a third light emitting layer 324 and a sixth semiconductor layer 326 from bottom to top. The fifth semiconductor layer 322 and the sixth semiconductor layer 326 are respectively disposed with a fifth electrode 328 and a sixth electrode 330, as shown in FIG. 2D. If the semiconductor epitaxial layers 32 are a plurality of diodes, it includes a fifth semiconductor layer 322 and a sixth semiconductor layer 326 from bottom to top. The fifth semiconductor layer 322 and the sixth semiconductor layer 326 are respectively disposed with a fifth electrode 328 and a sixth electrode 330, as shown in FIG. 2E. The fifth semiconductor layer 322 and the sixth semiconductor layer 326 are respectively connected with a plurality of conductors 28. That means the semiconductor epitaxial layer 32 is coupled to adjacent epoxy layer 32 by the first conductor 281 and the second conductor 282 of the plurality of conductors 28 that connect the fifth semiconductor layer 322 with the sixth semiconductor layer 326.

The bridge rectifier circuit 30 is also coupled to the plurality of semiconductor epitaxial layers 32 by the first conductor 281 and the second conductor 282 of the plurality of conductors 28. Thus the bridge rectifier circuit 30 will not have an open circuit while there is a break in one of the conductors 28. The second light emitting unit 26 in this embodiment is coupled to the bridge rectifier circuit 30.

Figure 3A:
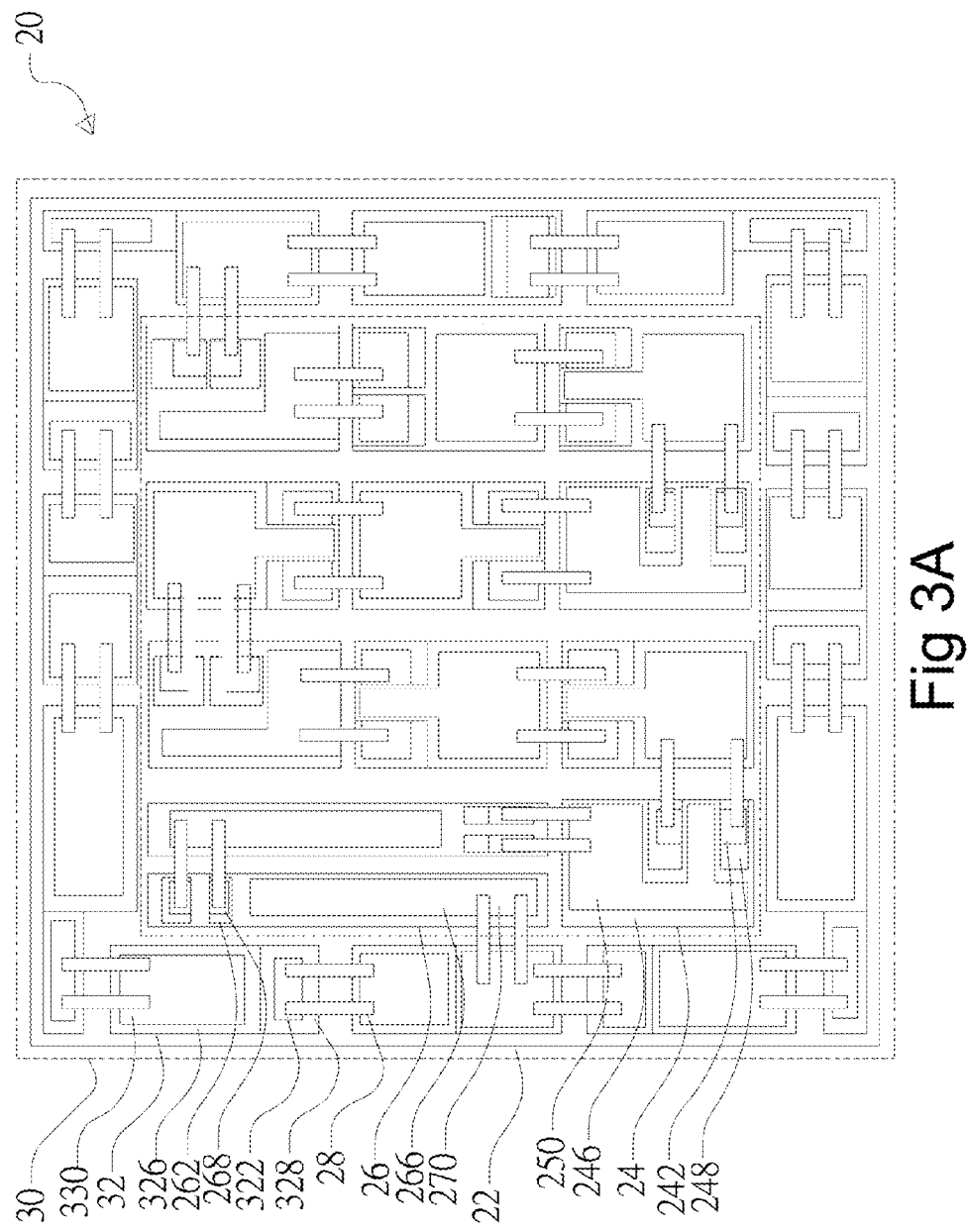
FIG. 3A is a top view of another embodiment of an AC lighting device according to the present invention.
Figure 3B:
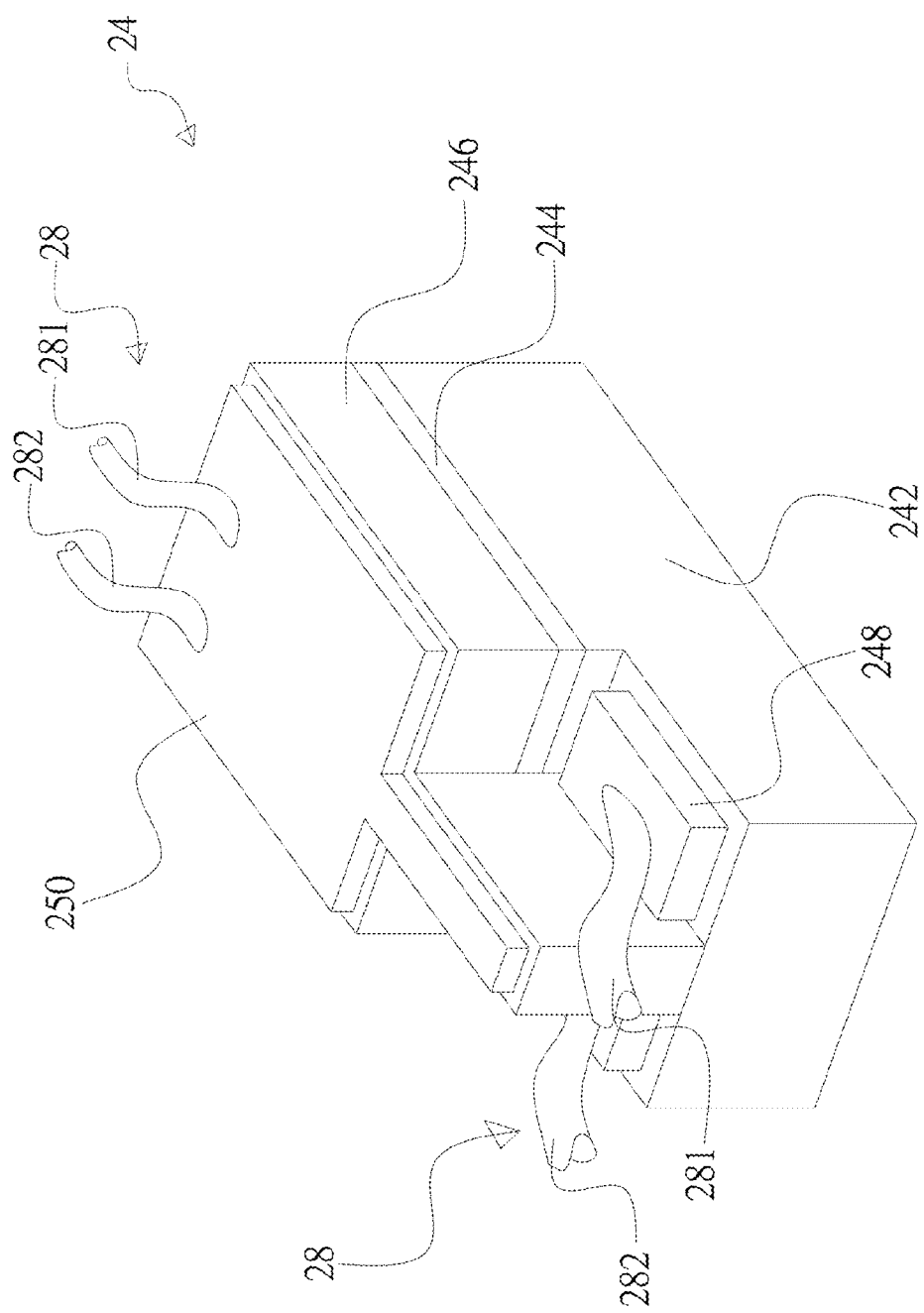
FIG. 3B is a schematic drawing showing part of another embodiment of an AC lighting device according to the present invention.

Refer from FIG. 3A to FIG. 3B, a top view and a schematic drawing of another embodiment according to the present invention are revealed. The difference between the embodiment shown from FIG. 2A to FIG. 2C (above one) and this embodiment is in that: the first semiconductor layer 242 and the third semiconductor layer 262 respective of the above embodiment respectively includes a first electrode 248 and a third electrode 268 coupled to a plurality of conductors 28 while the first semiconductor layer 242 and the third semiconductor layer 262 of this embodiment respectively includes a plurality of first electrodes 248 and a plurality of third electrodes 268. As shown in FIG. 3A, a first light emitting unit 24 and a second light emitting unit 26 are respectively coupled to adjacent light emitting units by means of a plurality of conductors 28. The first light emitting unit 24 and the second light emitting unit 26 respectively includes a plurality of first semiconductor layer 242 and a plurality of third semiconductor layer 262 that respectively is coupled to at least one conductor 28. In this embodiment, the first light emitting unit 24 includes two first electrodes 248 and the second light emitting unit 26 includes two third electrodes 268 while the number of the first electrode 248 and that of the third electrode 268 are not restricted. Each first electrode 248 as well as each third electrode 268 is disposed with a conductor 28 for coupling to adjacent light emitting units. Besides, each first electrode 248 and each third electrode 268 can also be arranged with a plurality of conductors 28.

Figure 3C:
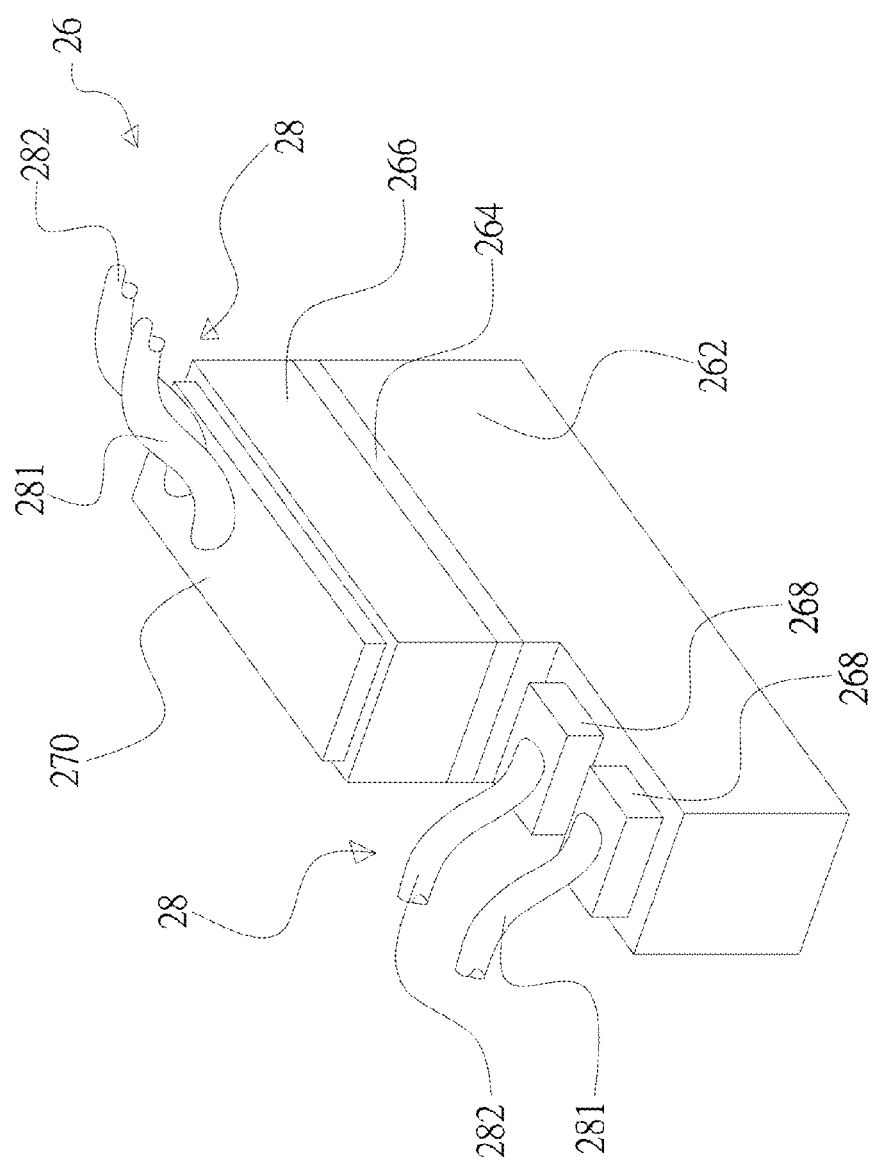
FIG. 3C is a schematic drawing showing part of another embodiment of an AC lighting device according to the present invention.

As shown in FIG. 3B, each of the first electrodes 248 on the two first semiconductor layers 242 is coupled with a first conductor 281 or a second conductor 282 for being coupled to adjacent lighting unit. The rest disposition is the same with that of the embodiment in FIG. 2B. Moreover, each first semiconductor layers 242 can also be connected with a plurality of conductors 28. Refer to FIG. 3C, each of the third electrode 268 on the two third semiconductor layers 262 is coupled to a first conductor 281 or a second conductor 282. Or each third semiconductor layers 262 can also be connected with a plurality of conductors 28.

Besides above embodiments, the plurality of first light emitting units 24 and the plurality of second light emitting units 26 of the AC lighting device 20 according to the present invention can be coupled and connected in series, parallel or combinations of both(series-parallel) to form a full wave AC light emitting device or a bridge AC light emitting device. That means by series, parallel or series-parallel connection of the plurality of first light emitting units 24 and the plurality of second light emitting units 26, there is no need to add the bridge rectifier circuit 30 into the AC light emitting device 20 of the present invention and the AC power supply can be used directly. Or by using part of the first light emitting units 24 and part of the second light emitting units 26 as the bridge rectifier circuit, the rest light emitting units use direct current output from the bridge rectifier circuit as the power source.

In addition, the plurality of first light emitting units 24 and the plurality of second light emitting units 26 have various geometric shapes such as rectangle, square, triangle, rhombus, trapezoid, polygon, convex shape, concave shape or combinations of above shapes. The light emitting units 24 and the second light emitting units 26 can have the same area being disposed on the substrate 22.

In summary, the present invention provides an AC light emitting device that includes a substrate, a plurality of first light emitting units and a plurality of second light emitting units. By means of the plurality of first light emitting units as well as second light emitting units with various area, light emitting area is effectively increased. Moreover, light emitting units are connected with one another through a plurality of conductors and the light emitting units are coupled to a rectifier circuit by a plurality of conductors. Moreover, semiconductor epitaxial layers of the rectifier circuit are also electrically coupled with one another by a plurality of conductors. Thus an open circuit will not occur once one of the conductors is broken.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An alternating current light emitting device comprising:
a substrate, and
a plurality of light emitting units having:
a first semiconductor layer disposed on the substrate;
a light emitting layer arranged over the first semiconductor layer; and
a second semiconductor layer disposed over the light emitting layer;

wherein the alternating current light emitting device further comprising at least one first electrode and at least one second electrode while the first electrode is arranged on the first semiconductor layer and the second electrode is disposed on the second semiconductor layer; the first electrode as well as the second electrode is coupled to adjacent light emitting unit by a plurality of conductors.

2. The device as claimed in claim 1, wherein the plurality of light emitting units is with the same or different area.

3. The device as claimed in claim 1, wherein the plurality of light emitting units is semiconductor epitaxial layer.

4. The device as claimed in claim 1, wherein a plurality of first electrodes respectively is arranged on the first semiconductor layer and each of the electrodes is coupled to adjacent light emitting unit by at least one of the conductors.

5. The device as claimed in claim 1, wherein connection directions of the plurality of conductors of the plurality of light emitting units are the same or are different.

6. The device as claimed in claim 5, wherein a plurality of first semiconductor layers of the plurality of light emitting units respectively is coupled to a second semiconductor layer of an adjacent light emitting unit by the plurality of conductors.

7. The device as claimed in claim 5, wherein a plurality of second semiconductor layers of the plurality of light emitting units respectively is coupled to a first semiconductor layer of adjacent light emitting units by the plurality of conductors.

8. The device as claimed in claim 1, wherein the plurality of light emitting units is with various geometric shapes.

9. The device as claimed in claim 8, wherein the geometric shapes include rectangle, square, triangle, rhombus, trapezoid, polygon, convex shape, concave shape or combinations of above shapes.

10. The device as claimed in claim 9, wherein the plurality of light emitting units are with the same or different area.

11. The device as claimed in claim 1, wherein the plurality of light emitting units are electrically connected in series, parallel or series-parallel to form a full wave AC light emitting device.

12. The device as claimed in claim 1, wherein the plurality of light emitting units are electrically connected in series, parallel or series-parallel to form a bridge AC light emitting device.

13. The device as claimed in claim 1, wherein the AC light emitting device further comprising a bridge rectifier circuit.

14. The device as claimed in claim 13, wherein the bridge rectifier circuit includes a plurality of semiconductor epitaxial layers.

15. The device as claimed in claim 14, wherein the plurality of semiconductor epitaxial layers is a plurality of third light emitting units, having a first semiconductor layer, a light emitting layer and a second semiconductor layer from bottom to top; wherein the semiconductor epitaxial layers further comprising a first electrode and a second electrode while the first electrode is disposed on the first semiconductor layer and the second electrode is arranged on the second semiconductor layer.

16. The device as claimed in claim 14, wherein the plurality of semiconductor epitaxial layers is a plurality of diodes, having a first semiconductor layer and a second semiconductor layer from bottom to top; wherein the semiconductor epitaxial layers further comprising a first electrode and a second electrode while the first electrode is disposed on the first semiconductor layer and the second electrode is arranged on the second semiconductor layer.

17. The device as claimed in claim 1, wherein at least two of the plurality of conductors are coupled to adjacent light emitting unit.

18. The device as claimed in claim 1, wherein a way of the plurality of conductors coupled to adjacent light emitting unit is parallel coupling or non-parallel coupling.

* * * * *